(12) United States Patent
Chen et al.

(10) Patent No.: US 11,581,250 B2
(45) Date of Patent: *Feb. 14, 2023

(54) PACKAGE WITH METAL-INSULATOR-METAL CAPACITOR AND METHOD OF MANUFACTURING THE SAME

(71) Applicant: Taiwan Semiconductor Manufacturing Co., Ltd., Hsin-Chu (TW)

(72) Inventors: Shuo-Mao Chen, New Taipei (TW); Der-Chyang Yeh, Hsin-Chu (TW); Chiung-Han Yeh, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 65 days.

This patent is subject to a terminal disclaimer.

(21) Appl. No.: 17/218,285

(22) Filed: Mar. 31, 2021

(65) Prior Publication Data
US 2021/0217691 A1 Jul. 15, 2021

Related U.S. Application Data

(63) Continuation of application No. 16/578,359, filed on Sep. 22, 2019, now Pat. No. 10,971,441, which is a
(Continued)

(51) Int. Cl.
*H01L 23/498* (2006.01)
*H01L 23/00* (2006.01)
(Continued)

(52) U.S. Cl.
CPC ...... *H01L 23/49822* (2013.01); *H01L 21/568* (2013.01); *H01L 23/5389* (2013.01);
(Continued)

(58) Field of Classification Search
CPC ............... H01L 21/568; H01L 23/3114; H01L 23/19816; H01L 23/49822; H01L 23/5222;
(Continued)

(56) References Cited

U.S. PATENT DOCUMENTS 5,244,833 A 9/1993 Gansauge et al.
5,841,193 A 11/1998 Eichelberger et al.
(Continued)

OTHER PUBLICATIONS

Non-Final Office Action dated Oct. 8, 2013 for U.S. Appl. No. 13/536,877.
(Continued)

*Primary Examiner* — David C Spalla
(74) *Attorney, Agent, or Firm* — Eschweiler & Potashnik, LLC

(57) ABSTRACT

A package includes a chip formed in a first area of the package and a molding compound formed in a second area of the package adjacent to the first area. A first polymer layer is formed on the chip and the molding compound, a second polymer layer is formed on the first polymer layer, and a plurality of interconnect structures is formed between the first polymer layer and the second polymer layer. A metal-insulator-metal (MIM) capacitor is formed on the second polymer layer and electrically coupled to at least one of the plurality of interconnect structures. A metal bump is formed over and electrically coupled to at least one of the plurality of interconnect structures.

20 Claims, 18 Drawing Sheets

Related U.S. Application Data continuation of application No. 16/371,356, filed on Apr. 1, 2019, now Pat. No. 10,475,731, which is a continuation of application No. 15/937,188, filed on Mar. 27, 2018, now Pat. No. 10,276,484, which is a continuation of application No. 13/536,877, filed on Jun. 28, 2012, now Pat. No. 9,960,106.

(60) Provisional application No. 61/649,140, filed on May 18, 2012.

(51) Int. Cl.
- *H01L 23/538* (2006.01)
- *H01L 21/56* (2006.01)
- *H01L 23/31* (2006.01)

(52) U.S. Cl.
CPC .............. *H01L 24/05* (2013.01); *H01L 24/19* (2013.01); *H01L 23/3128* (2013.01); *H01L 23/49816* (2013.01); *H01L 2224/02233* (2013.01); *H01L 2224/02331* (2013.01); *H01L 2224/02381* (2013.01); *H01L 2224/03* (2013.01); *H01L 2224/0401* (2013.01); *H01L 2224/04105* (2013.01); *H01L 2224/05008* (2013.01); *H01L 2224/05026* (2013.01); *H01L 2224/0558* (2013.01); *H01L 2224/05099* (2013.01); *H01L 2224/05124* (2013.01); *H01L 2224/05147* (2013.01); *H01L 2224/05552* (2013.01); *H01L 2224/05572* (2013.01); *H01L 2224/05624* (2013.01); *H01L 2224/05647* (2013.01); *H01L 2224/0603* (2013.01); *H01L 2224/06051* (2013.01); *H01L 2224/06515* (2013.01); *H01L 2224/12105* (2013.01); *H01L 2224/13005* (2013.01); *H01L 2224/13111* (2013.01); *H01L 2224/13113* (2013.01); *H01L 2224/13116* (2013.01); *H01L 2224/13139* (2013.01); *H01L 2224/13147* (2013.01); *H01L 2224/13155* (2013.01); *H01L 2224/96* (2013.01); *H01L 2924/00014* (2013.01); *H01L 2924/181* (2013.01); *H01L 2924/18162* (2013.01); *H01L 2924/19041* (2013.01); *H01L 2924/19103* (2013.01); *H01L 2924/206* (2013.01)

(58) Field of Classification Search
CPC . H01L 23/5223; H01L 23/5389; H01L 24/05; H01L 24/19; H01L 2224/02233; H01L 2224/02331; H01L 2224/02381; H01L 2224/03; H01L 2224/0401; H01L 2224/04105; H01L 2224/05008; H01L 2224/05026; H01L 2224/05099; H01L 2224/05124; H01L 2224/05147; H01L 2224/05552; H01L 2224/05572; H01L 2224/0558; H01L 2224/05624; H01L 2224/05647; H01L 2224/0603; H01L 2224/06051; H01L 2224/06515; H01L 2224/12105; H01L 2224/13005; H01L 2224/13111; H01L 2224/13113; H01L 2224/13116; H01L 2224/13139; H01L 2224/13147; H01L 2224/13155; H01L 2924/00014; H01L 2924/181; H01L 2924/18162; H01L 2924/19041; H01L 2924/19103; H01L 2924/206

See application file for complete search history.

(56) References Cited

U.S. PATENT DOCUMENTS

| | | |
|---|---|---|
| 6,897,544 B2 | 5/2005 | Ooi et al. |
| 6,998,308 B2 | 2/2006 | Ooi et al. |
| 7,538,375 B2 | 5/2009 | Kim et al. |
| 7,777,300 B2 | 8/2010 | Tews et al. |
| 8,133,762 B2 | 3/2012 | Pagaila et al. |
| 8,288,209 B1 | 10/2012 | Chi et al. |
| 8,710,658 B2 | 4/2014 | Aboush |
| 9,960,106 B2 | 5/2018 | Chen et al. |
| 10,971,441 B2 * | 4/2021 | Chen ................... H01L 23/5389 |
| 2002/0017730 A1 | 2/2002 | Tahara et al. |
| 2005/0006688 A1 | 1/2005 | Solo De Zaldivar |
| 2006/0024899 A1 | 2/2006 | Crenshaw et al. |
| 2006/0125110 A1 | 6/2006 | Do et al. |
| 2007/0069346 A1 | 3/2007 | Lin et al. |
| 2007/0114634 A1 | 5/2007 | Lin et al. |
| 2007/0205520 A1 | 9/2007 | Chou et al. |
| 2009/0224402 A1 | 9/2009 | Do et al. |
| 2009/0309212 A1 | 12/2009 | Shim et al. |
| 2010/0059854 A1 | 3/2010 | Lin et al. |
| 2010/0237495 A1 | 9/2010 | Pagaila et al. |
| 2010/0244190 A1 | 9/2010 | Nakano |
| 2011/0062549 A1 * | 3/2011 | Lin ....................... H01L 23/642 |
| | | 257/532 |
| 2011/0204509 A1 | 8/2011 | Lin et al. |
| 2012/0112314 A1 * | 5/2012 | Jou ......................... H01L 28/60 |
| | | 257/532 |
| 2012/0181657 A1 | 7/2012 | Wu et al. |
| 2012/0223426 A9 | 9/2012 | Shim et al. |
| 2012/0228755 A1 | 9/2012 | Nagano et al. |
| 2012/0292738 A1 | 11/2012 | Lin et al. |
| 2012/0299169 A1 | 11/2012 | Kim et al. |
| 2013/0168805 A1 | 7/2013 | Yu et al. |
| 2013/0181323 A9 | 7/2013 | Lin |
| 2017/0207147 A1 | 7/2017 | Liao et al. |

OTHER PUBLICATIONS

Non-Final Office Action dated Jul. 2, 2014 for U.S. Appl. No. 13/536,877.
Final Office Action dated Feb. 6, 2015 for U.S. Appl. No. 13/536,877.
Non-Final Office Action dated Jul. 22, 2015 for U.S. Appl. No. 13/536,877.
Non-Final Office Action dated Apr. 1, 2016 for U.S. Appl. No. 13/536,877.
Final Office Action dated Sep. 7, 2016 for U.S. Appl. No. 13/536,877.
Non-Final Office Action dated Feb. 24, 2017 for U.S. Appl. No. 13/536,877.
Final Office Action dated Sep. 21, 2017 for U.S. Appl. No. 13/536,877.
Notice of Allowance dated Dec. 20, 2017 for U.S. Appl. No. 13/536,877.
Non-Final Office Action dated Jul. 6, 2018 for U.S. Appl. No. 15/937,188.
Notice of Allowance dated Jan. 9, 2019 for U.S. Appl. No. 15/937,188.
Notice of Allowance dated Jun. 26, 2019 for U.S. Appl. No. 16/371,356.
Non-Final Office Action dated May 29, 2020 for U.S. Appl. No. 16/578,359.
Notice of Allowance dated Nov. 30, 2020 for U.S. Appl. No. 16/578,359.

\* cited by examiner

PACKAGE WITH METAL-INSULATOR-METAL CAPACITOR AND METHOD OF MANUFACTURING THE SAME

REFERENCE TO RELATED APPLICATIONS

This Application is a Continuation of U.S. application Ser. No. 16/578,359, filed on Sep. 22, 2019, which is a Continuation of U.S. application Ser. No. 16/371,356, filed on Apr. 1, 2019 (now U.S. Pat. No. 10,475,731, issued on Nov. 12, 2019), which is a Continuation of U.S. application Ser. No. 15/937,188, filed on Mar. 27, 2018 (now U.S. Pat. No. 10,276,484, issued on Apr. 30, 2019), which is a Continuation of U.S. application Ser. No. 13/536,877, filed on Jun. 28, 2012 (now U.S. Pat. No. 9,960,106, issued on May 1, 2018), which claims the benefit of U.S. Provisional Application No. 61/649,140, filed on May 18, 2012. The contents of the above-referenced Patent Applications are hereby incorporated by reference in their entirety.

TECHNICAL FIELD

The disclosure relates to packages and methods of manufacturing the packages, and more particularly to packages with metal-insulator-metal (MIM) capacitors and methods of manufacturing the same.

BACKGROUND

Radio frequency (RF) and mixed-signal integrated circuits employ capacitor elements for decoupling, filtering, oscillating, etc. Metal-insulator-metal (MIM) capacitor structure has been the most popular capacitor in analog, mixed-signal and RF devices, due to an advantage that metal provides depletion-free, high-conductance electrodes suitable for high-speed applications at low cost. The MIM capacitor structure has an advantage of flexibility in inserting it between two intermediate metal levels. For increasingly complex mixed-signal and RF applications, the MIM capacitor area is limited by chip size parameters.

DETAILED DESCRIPTION

Figure 1:
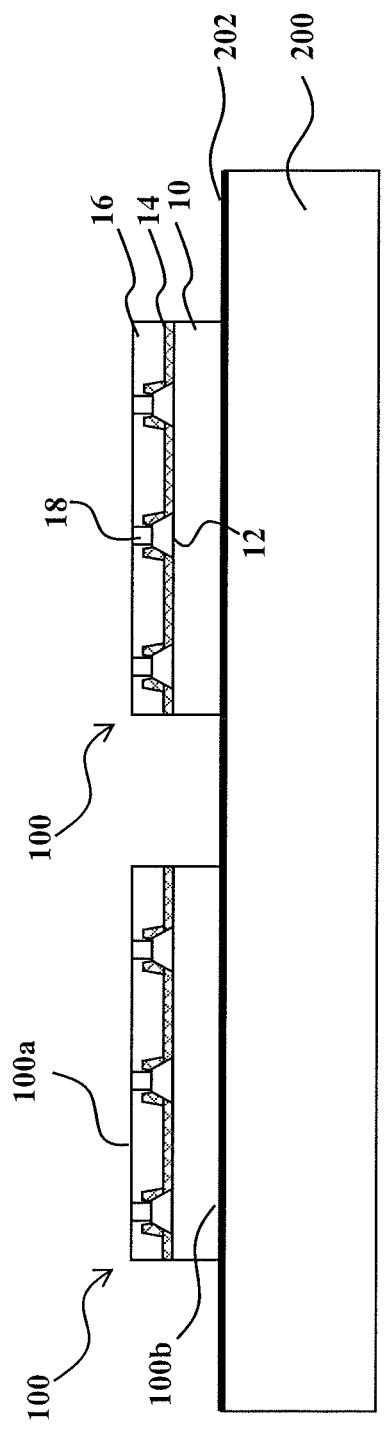
FIGS. 1-10 are cross-sectional views of a method of manufacturing a package with a metal-insulator-metal (MIM) capacitor according to one or more embodiments.

It is to be understood that the following disclosure provides many different embodiments or examples, for implementing different features of various embodiments. Specific examples of components and arrangements are described below to simplify the present disclosure. The present disclosure may, however, be embodied in many different forms and should not be construed as being limited to the embodiments set forth herein; rather, these embodiments are provided so that this description will be thorough and complete, and will fully convey the present disclosure to those of ordinary skill in the art. It will be apparent, however, that one or more embodiments may be practiced without these specific details.

In the drawings, the thickness and width of layers and regions are exaggerated for clarity. Like reference numerals in the drawings denote like elements. The elements and regions illustrated in the figures are schematic in nature, and thus relative sizes or intervals illustrated in the figures are not intended to limit the scope of the present disclosure.

FIGS. 1-10 are cross-sectional views of a package at various stages of a method of manufacturing the package with a metal-insulator-metal (MIM) capacitor according one or more embodiments.

Referring to FIG. 1, at least one chip 100 is attached to a carrier wafer 200 through an adhesive film 202. Several dozen chips 100 or several hundred chips 100 or more may be attached to the carrier wafer 200, depending on the size of the chips 100, the size of carrier wafer 200, and the particular application, as examples. The chip 100 has a first side 100a (also referred to herein as a front side 100a) and a second side 100b (also referred to herein as a back side 100b). The chip 100 has semiconductor devices or integrated circuits that have been previously manufactured on a wafer and then singulated from the wafer. The chip 100 may comprise one or more layers of electrical circuitry and/or electronic functions formed on a semiconductor substrate, and may include conductive lines, vias, capacitors, diodes, transistors, resistors, inductors, and/or other electrical components, for example. A pick and place machine may be used to place the chip 100 in predetermined locations on the carrier wafer 200, for example. In some embodiments, the back side 100b of the chip 100 is attached to the adhesive film 202, such that the chip 100 is mounted face-up on the carrier wafer 200.

The chip 100 shown in FIG. 1 includes a semiconductor substrate 10, a plurality of pads 12, a passivation layer 14, an insulating layer 16 and a plurality of contacts 18. The semiconductor substrate 10 having electrical circuitry formed therein and/or thereon in accordance with some embodiments. The semiconductor substrate 10 may comprise, for example, bulk silicon, doped or undoped, or an active layer of a semiconductor-on-insulator (SOI) substrate. Other substrates, such as a multi-layered or gradient substrate may also be used. The electrical circuitry formed in and/or on the semiconductor substrate 10 may be any type of circuitry suitable for a particular application. In some embodiments, the electrical circuitry includes electrical devices formed on the substrate 10 having one or more dielectric layers overlying the electrical devices. Metal layers may be formed between dielectric layers to route electrical signals between the electrical devices. Electrical devices may also be formed in one or more dielectric layers. For example, the electrical circuitry may include various N-type metal-oxide semiconductor (NMOS) and/or P-type metal-oxide semiconductor (PMOS) devices, such as transistors, capacitors, resistors, diodes, photo-diodes, fuses, and the like, interconnected to perform one or more functions. The functions may include memory structures, processing structures, sensors, amplifiers, power distribution, input/output circuitry, or the like. One of ordinary skill in the art will appreciate that the above examples are provided for illustrative purposes only to further explain applications of some illustrative embodiments and are not meant to limit the disclosure in any manner. Other circuitry may be used as appropriate for a given application. One or more dielectric layers and associated metallization layers are formed over the electrical circuitry, and contacts may be formed through the dielectric layer to provide a connection to the electrical circuitry.

The pads 12 are formed on the semiconductor substrate 10. In some embodiments, the pad 12 is formed of aluminum, aluminum copper, aluminum alloys, copper, copper alloys, or the like. One or more passivation layers, such as a passivation layer 14 are formed and patterned over the pad 12. In some embodiments, the passivation layer 14 is formed of a dielectric material, such as undoped silicate glass (USG), silicon nitride, silicon oxide, silicon oxynitride or a non-porous material by any suitable method, such as chemical vapor deposition (CVD), physical vapor deposition (PVD), or the like. The passivation layer 14 is formed and patterned to cover a peripheral portion of the pad 12, and to expose a portion of the pad 12 through an opening in passivation layer 14. The contacts 18 are formed over the exposed portions of the pads 12 through openings in the insulating layer 16 over the passivation layer 14. In some embodiments, the contact 18 is formed of copper, copper alloys, aluminum, aluminum alloys, or the like. The contacts 18 may be formed as vias, plugs, pillars or lines in the insulating layer 16 to make electrical contact with the pads 12. In some embodiments, the insulating layer 16 is a polymer layer or a dielectric material. In at least one embodiment, the top surface of the contacts 18 are exposed from the insulating layer 16 for electrical coupling to subsequently formed wiring layers.

Figure 2:
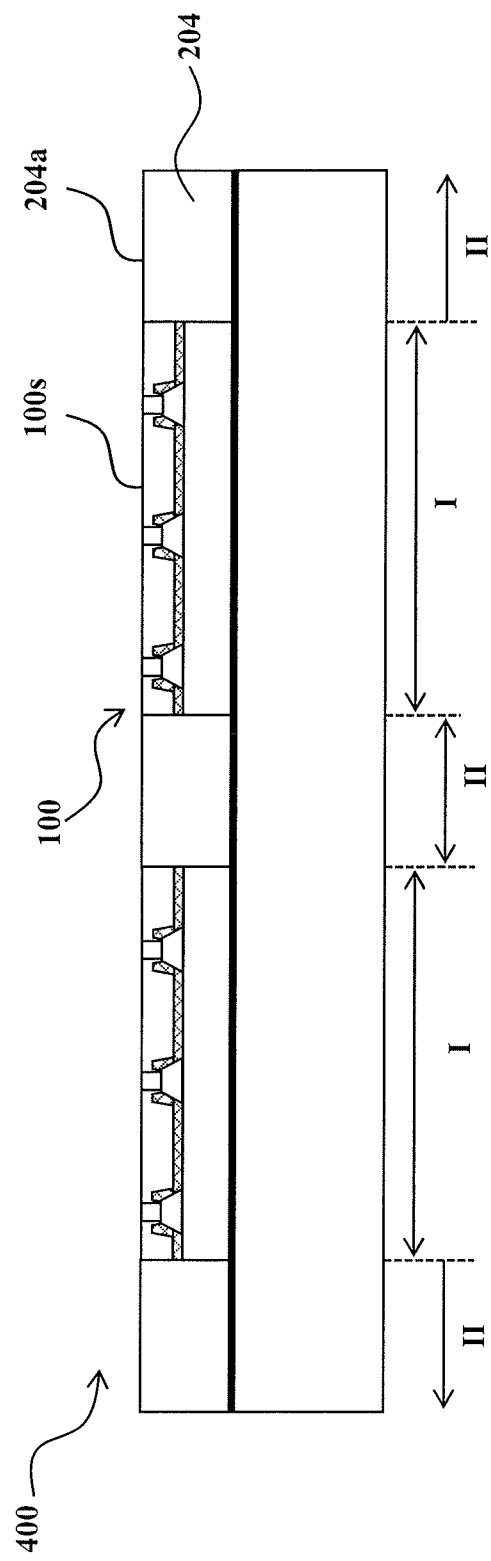

Referring to FIG. 2, a molding compound 204 is formed to fill gaps between the chips 100. In some embodiments, the molding compound 204 is provided over the chips 100 and portions of the adhesive film 202 between the chips 100, and then a grinding process is performed on the molding compound 204 to expose a top surface 100s of the front side 100a of each chip 100, so that the top surface 204a of the molding compound 204 becomes substantially level with the top surfaces 100s of the chips 100. The grinding process may planarize the top surface 100s of the chip 104, so that any unevenness in the top surface 100s of the chip 100 may be at least reduced, and possibly substantially eliminated. Furthermore, a height or thickness of the chip 100 may be reduced to a selected height through the grinding process. This results in a reconstructed wafer 400 that includes first areas I (also referred to herein as chip areas I) and second areas II (also referred to herein as fan-out areas II). On the chip area I, the chip 100 is formed. On the fan-out area II, the molding compound 204 is formed. Subsequently formed wiring layers can be formed over the molding compound 204 to electrically connect the chip 100.

Figure 3:
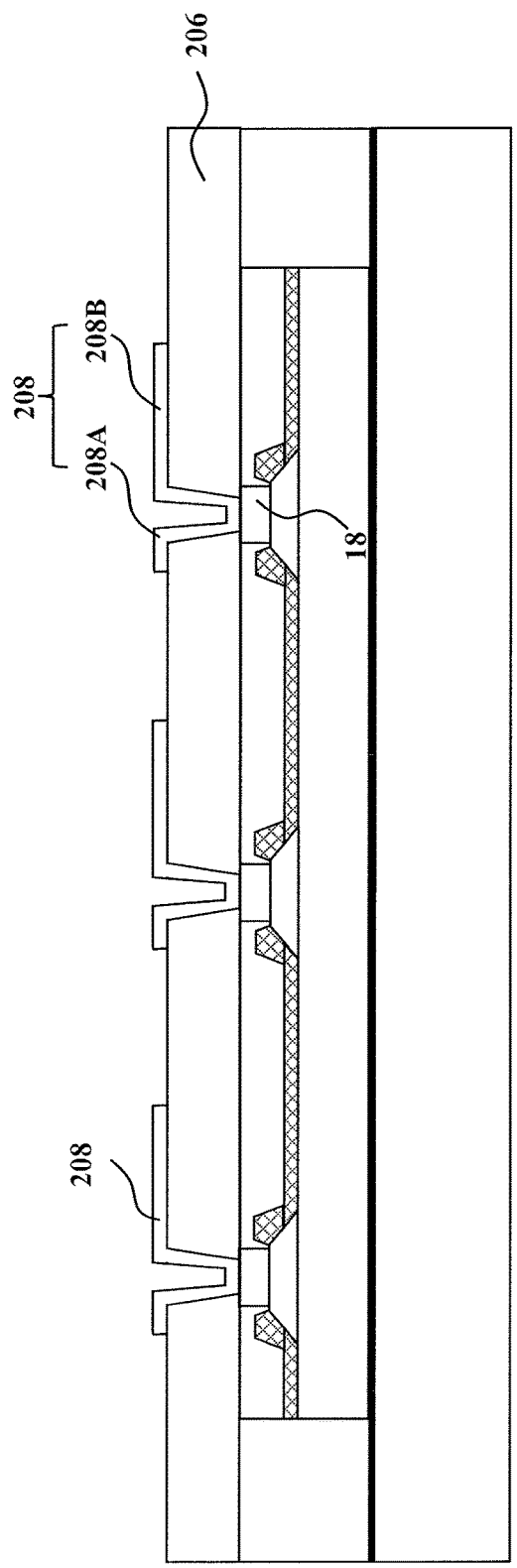

Referring to FIG. 3, a first polymer layer 206 is formed and patterned on the reconstructed wafer 400 to cover the top surfaces 100s of the chips 100 and the top surface 204a of the molding compound 204, and then post-passivation interconnect (PPI) structures 208 are formed on the first polymer layer 206. In some embodiments, the first polymer layer 206 includes a polybenzoxazole (PBO) layer, a polyimide layer, a benzocyclobutene (BCB) layer, an epoxy layer, or a photo-sensitive material layer. In at least one exemplary embodiment, the first polymer layer 206 is formed of low-temperature PBO layer. The first polymer layer 206 can be patterned by photolithography processes to form openings, through which the underlying contacts 18 are exposed. The PPI structures 208 can be electrically coupled to the contacts 18 of the chips 100 through the openings formed in the patterned polymer layer 206. In some embodiments, the PPI structures 208 are metallization layers formed of copper, aluminum, copper alloys, or other mobile conductive materials using plating, electroless plating, sputtering, chemical vapor deposition methods with a photoresist mask. The PPI structures 208 can be formed in the openings of the first polymer layer 206 to electrically connect with the contacts 18, and extend to the surface of the first polymer layer 206. In some embodiments, the PPI structures 208 can be formed over the chip areas I and/or the fan-out areas II. The PPI structures 208 can function as interconnection layers, power lines, re-distribution lines (RDL), inductors, capacitors or any passive components. Each PPI structure 208 includes a first region 208A and a second region 208B. The first region 208A is also referred to herein as an interconnect line region 208A, and the second region 208B is also referred to herein as a landing region 208B on which a bump feature and/or a capacitor will be formed in subsequent processes. The embodiment of FIG. 3 shows the landing region 208B positioned outside the contact 18. In other embodiments, the landing region 208B can be formed directly over the contact 18 through the routing of the PPI structures 208.

Figure 4:
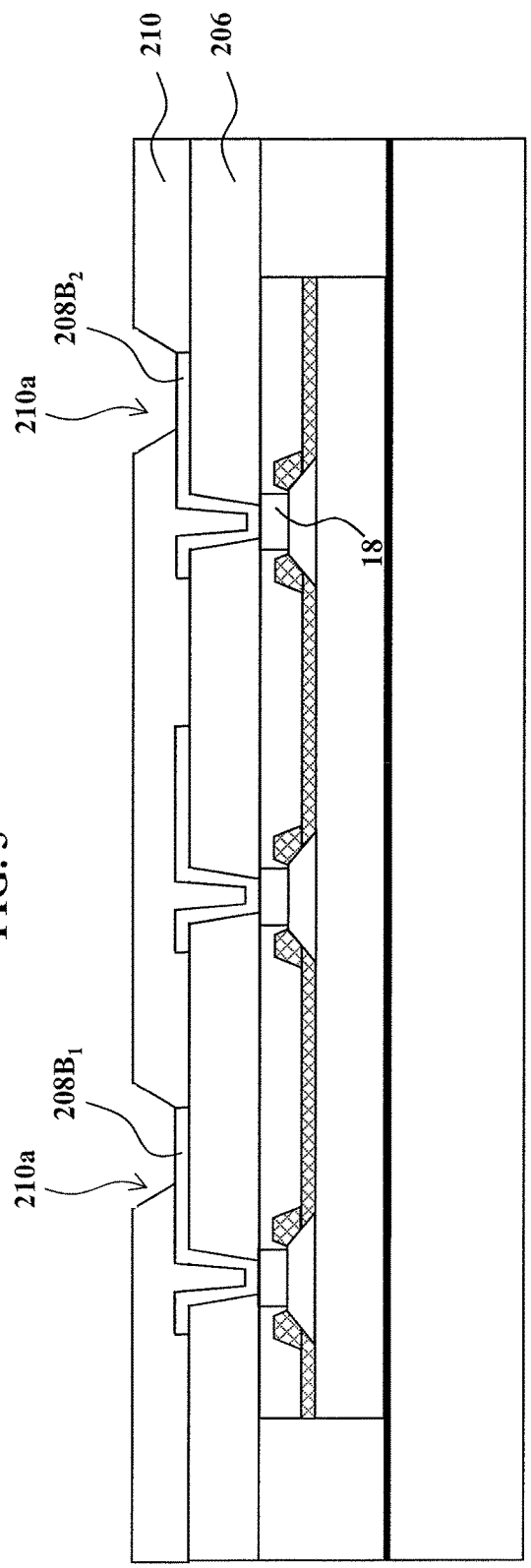

Referring to FIG. 4, a second polymer layer 210 is formed on the first polymer layer 206 and the PPI structures 208. A plurality of openings 210a is formed in the second polymer layer 210 to expose a portion of the second region 208B of the PPI structures 208. In some embodiments, the second polymer layer 210 includes a polybenzoxazole (PBO) layer, a polyimide layer, a benzocyclobutene (BCB) layer, an epoxy layer, or a photo-sensitive material layer. The second polymer layer 210 may be formed of the same material as the first polymer layer 206. The designs on number and location of the openings 210 are flexible according to device performance requests. The embodiment in FIG. 4 shows the openings 210a exposing the first landing region $208B_1$ on which a capacitor will be formed and the second landing region $208B_2$ on which a bump will be formed.

Figure 5:
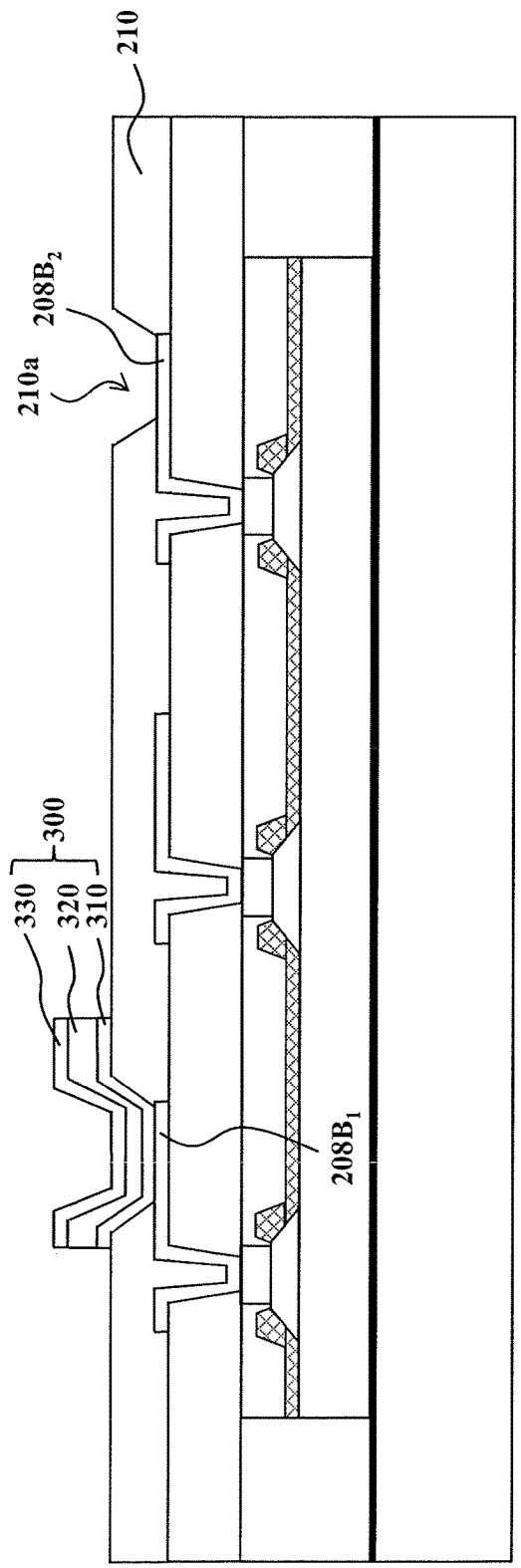

FIG. 5 shows the formation of a metal-insulator-metal (MIM) capacitor 300 on the first landing region $208B_1$ of the PPI structure 208, leaving the second landing region $208B_2$ for bump formation. In at least one embodiment, the MIM capacitor 300 is formed on the first landing region $208B_1$ through the opening 210a of the second polymer layer 210, and the MIM capacitor 300 may extend to the surface of the second polymer layer 210. In at least one embodiment, the MIM capacitor 300 includes a lower metal layer 310; an upper metal layer 330 and a capacitor dielectric layer 320 formed between the metal layers 310 and 330. The lower metal layer 310 may include a titanium (Ti) layer, a titanium nitride (TiN) layer, or combinations thereof. The upper metal layer 330 may include a titanium (Ti) layer, a titanium nitride (TiN) layer, or combinations thereof. In some embodiments, the lower metal layer 310 has a thickness between about 500 Angstroms and about 1500 Angstroms, and the upper metal layer 330 has a thickness between about 500 Angstroms and about 1500 Angstroms. The capacitor dielectric layer 320 may include a nitride layer, a silicon nitride layer, or other dielectric material layers of high dielectric constant. In some embodiments, the capacitor dielectric layer 320 is a silicon nitride layer deposited by low-temperature CVD or plasma-enhanced CVD (PECVD) methods. In some embodiments, the capacitor dielectric layer 320 is a silicon nitride layer of a thickness of about 250 Angstroms or less formed by a PECVD method at a process temperature less than about 200 degree Celsius, thereby achieving an enhanced capacitance density in the MIM capacitor 300 greater than about 2 fF/cm². In at least one exemplary embodiment, the formation of the MIM capacitor 300 includes the step of forming the lower metal layer 310 on the exposed portions of the first landing region 208B$_1$ along the sidewalls and bottom of the opening 210a of the second polymer layer 210 by depositing, photolithography and etching methods. Then, the capacitor dielectric layer 320 and the upper metal layer 330 are successively deposited on the resulted surface followed by photolithography and etching processes such that the capacitor dielectric layer 320 and the upper metal layer 330 are formed on the lower metal layer 310.

Figure 6:
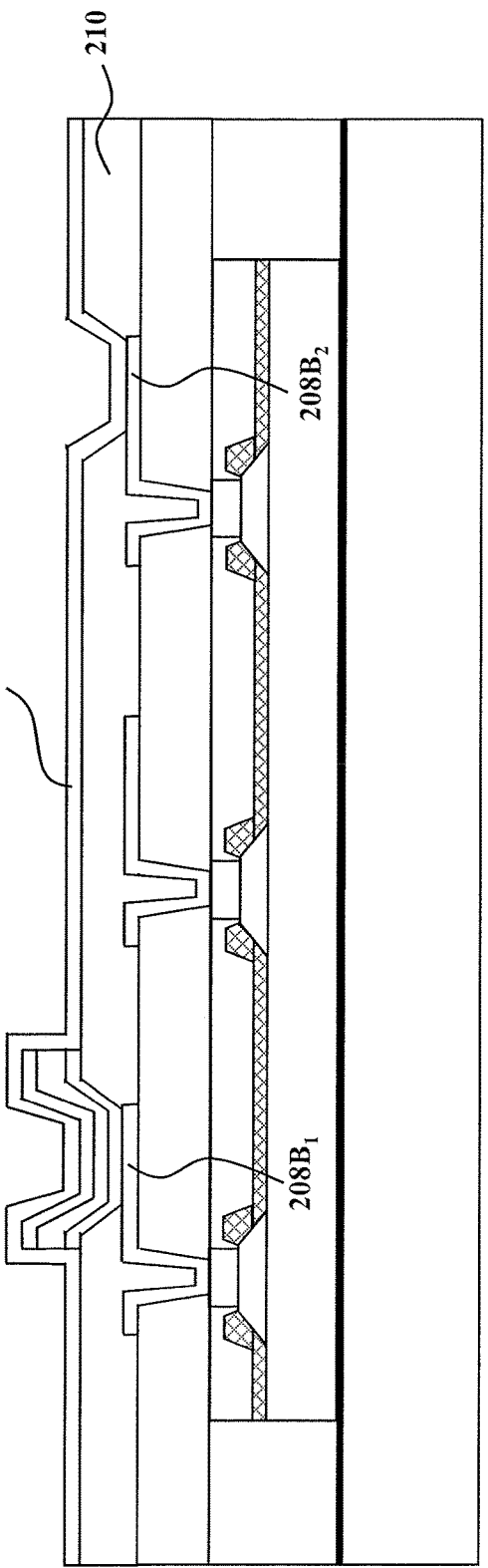

Referring to FIG. 6, a barrier layer 212 is formed on the resulted structure to cover the MIM capacitor 300, the second polymer layer 210 and the exposed portion of the second landing region 208B$_2$ of the PPI structure 208. In some embodiments, the barrier layer 212 includes at least one metallization layer comprising titanium (Ti), tantalum (Ta), titanium nitride (TiN), tantalum nitride (TaN), copper (Cu), copper alloys, nickel (Ni), tin (Sn), gold (Au), or combinations thereof. In some embodiments, the barrier layer 212 includes at least one Ti layer and at least one Cu layer.

Figure 7:
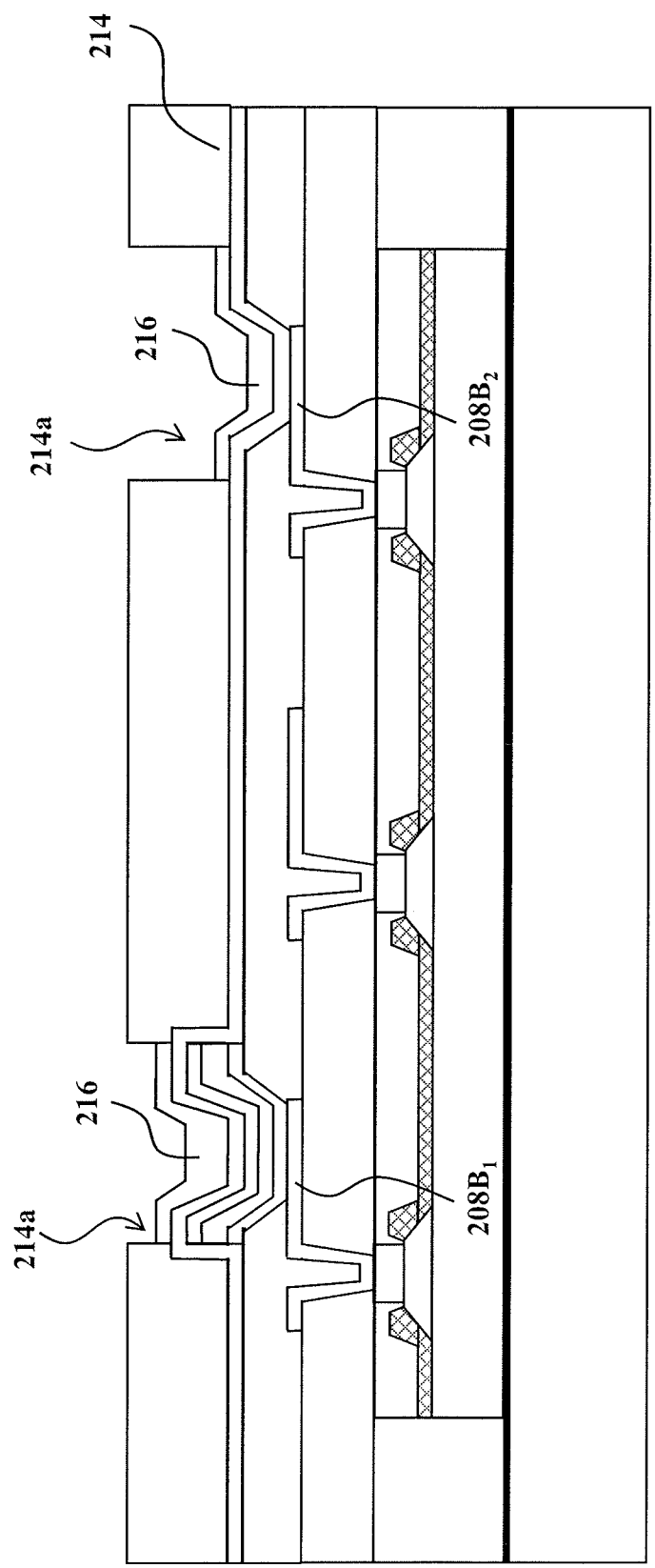

Referring to FIG. 7, a mask layer 214 is then formed on the barrier layer 212 for defining bump windows. In an embodiment, the mask layer 214 is formed of a photoresist which is patterned with openings 214a. In some embodiments, the openings 214a are directly over the first landing region 208B$_1$ and/or the second landing region 208B$_2$. In some embodiments, at least one of the openings 214a is directly over the MIM capacitor 300. The embodiment of FIG. 7 shows the openings 214a over the first landing region 208B$_1$ on which the MIM capacitor 300 is formed and the second landing region 208B$_2$ on which the MIM capacitor 300 is not formed. Next, a plating step is performed to form under-bump metallization (UBM) layers 216 within the openings 214a, so that the UBM layers 216 are formed over the exposed portions of the barrier layer 212 to make electrical contact with the PPI structures 208. In some embodiments, the UBM layers 216 are formed of copper, copper alloys, aluminum, aluminum alloys, or the like. The UBM layers 216 may be formed as thin layers or pillars.

Figure 8:
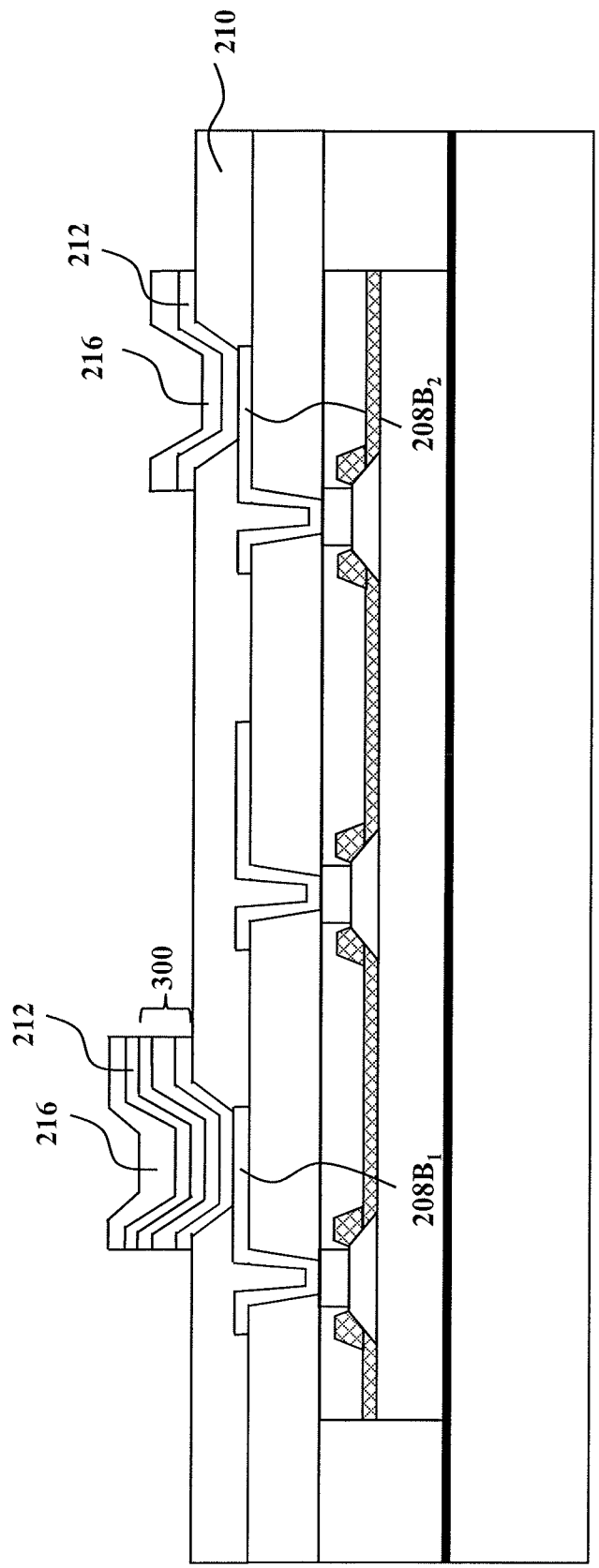

Referring to FIG. 8, the mask layer 214 is removed followed by patterning of the barrier layer 212, so that portions of the barrier layer 212 not covered by the UBM layers 216 are etched away and portions of the second polymer layer 210 not covered by the UBM layers 216 are exposed again.

Figure 9:
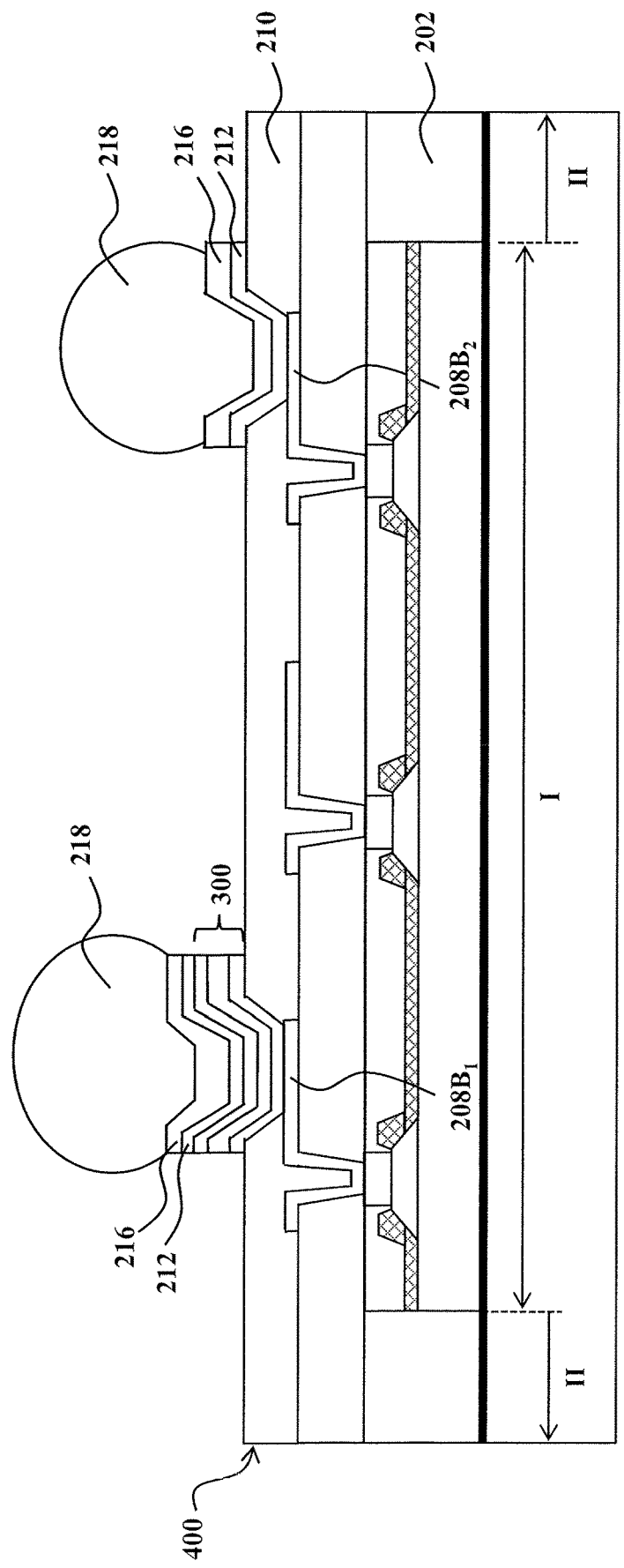

Referring to FIG. 9, at least one bump 218 is formed on at least one of the UBM layers 216. In some embodiments, one bump 218 is formed on each of the UBM layers 216. In some embodiments, the bumps 218 are solder bumps, Cu bumps, metal bumps including Ni or Au, or combinations thereof. In some embodiments, the bumps 218 are solder bumps formed by placing solder balls on the UBM layers 216 and then thermally reflowing the solder balls. In at least one embodiment, the solder bumps have a diameter greater than about 200 μm. In some embodiments, the solder bump includes a lead-free pre-solder layer, SnAg, or a solder material including alloys of tin, lead, silver, copper, nickel, bismuth, or combinations thereof. In some embodiments, the solder bump is formed by plating a solder layer using photolithography technologies followed by reflow processes.

Figure 10:
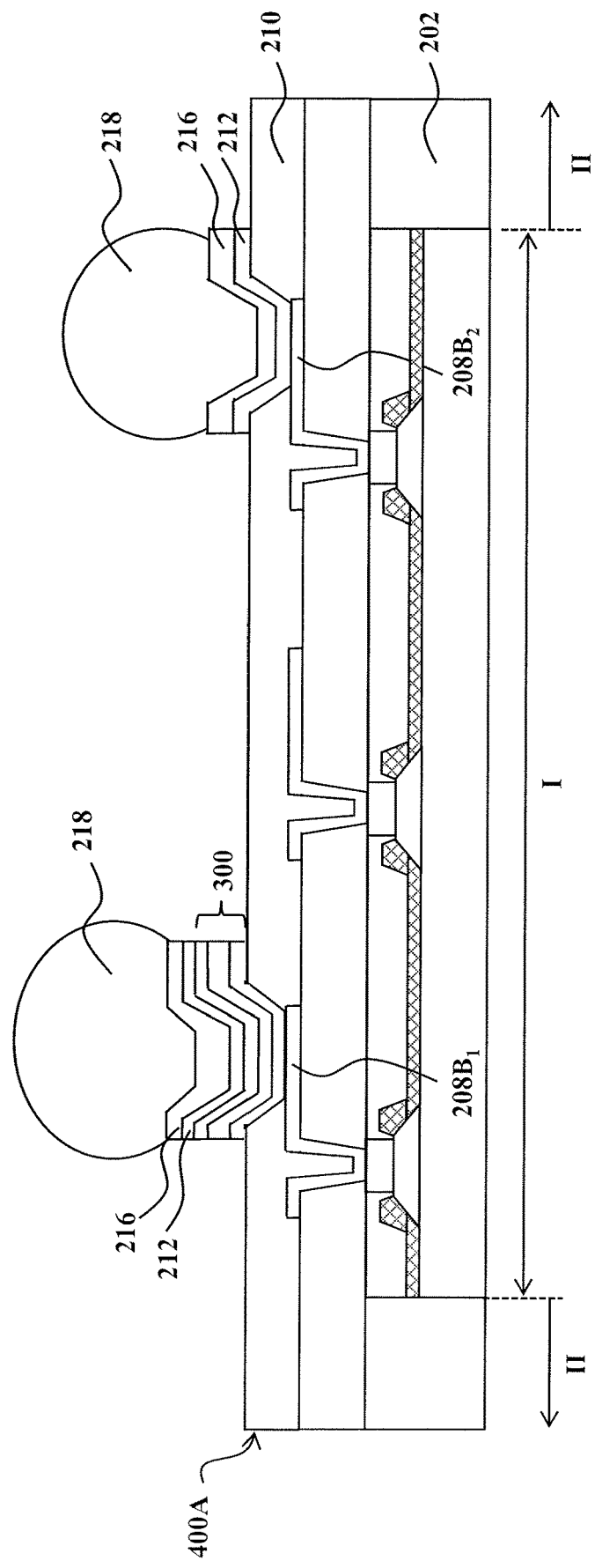

Next, as shown in FIG. 10, The reconstructed wafer 400 is detached from the carrier wafer 200, and sawed into a plurality of individual packages 400A (also referred to herein as fan-out packages). The fan-out package 400A includes at least one chip 100 formed in the chip area I, at least one MIM capacitor 300 formed on the second polymer layer 210 in the chip area I, and the fan-out interconnects formed in the chip area I and/or fan-out area II. The MIM capacitor 300 is formed on the second polymer layer 210, in which the upper metal layer 310 electrically connects to the UBM layer 216 and the lower metal layer 310 electrically connects to the PPI structure 208. The arrangement of the MIM capacitor 300, the UBM layer 216 and the PPI structure 208 can reduce back-end-of-line (BEOL) routing layers, save silicon area costs and reduce routing resistance. The above described process is applicable to analog, mixed-signal and RF devices.

Figure 11:
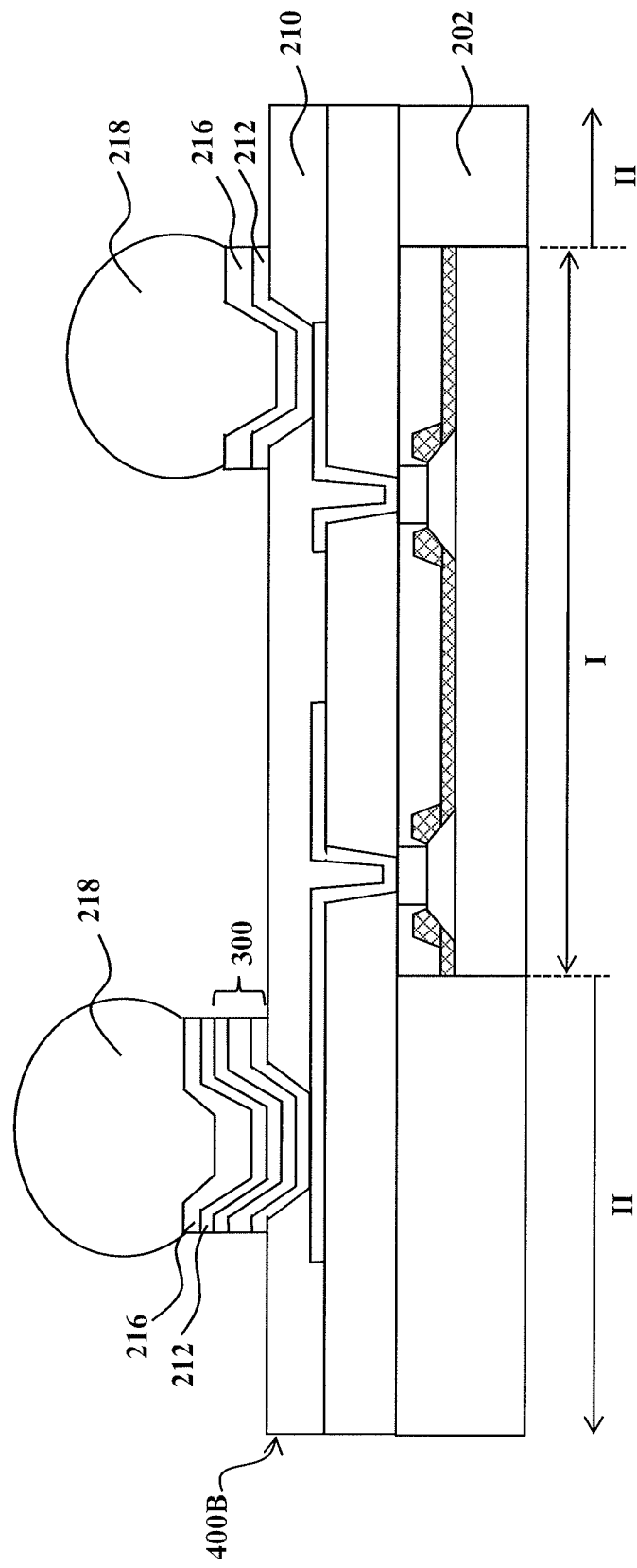
FIG. 11 is a cross-sectional view of a package with a MIM capacitor according to one or more embodiments.

The fan-out package 400A of FIG. 9 shows the embodiment of forming the MIM capacitor 300 on the second polymer layer 210 within the chip area I. In another embodiment, the fan-out package 400B of FIG. 11 shows the MIM capacitor 300 formed on the second polymer layer 210 on the fan-out area II, in which the MIM capacitor 300 can electrically connect the PPI structure 208 which extends to the fan-out area II. In some embodiments, the MIM capacitors 300 can be formed in both of the chip area I and the fan-out area II.

Figure 12:
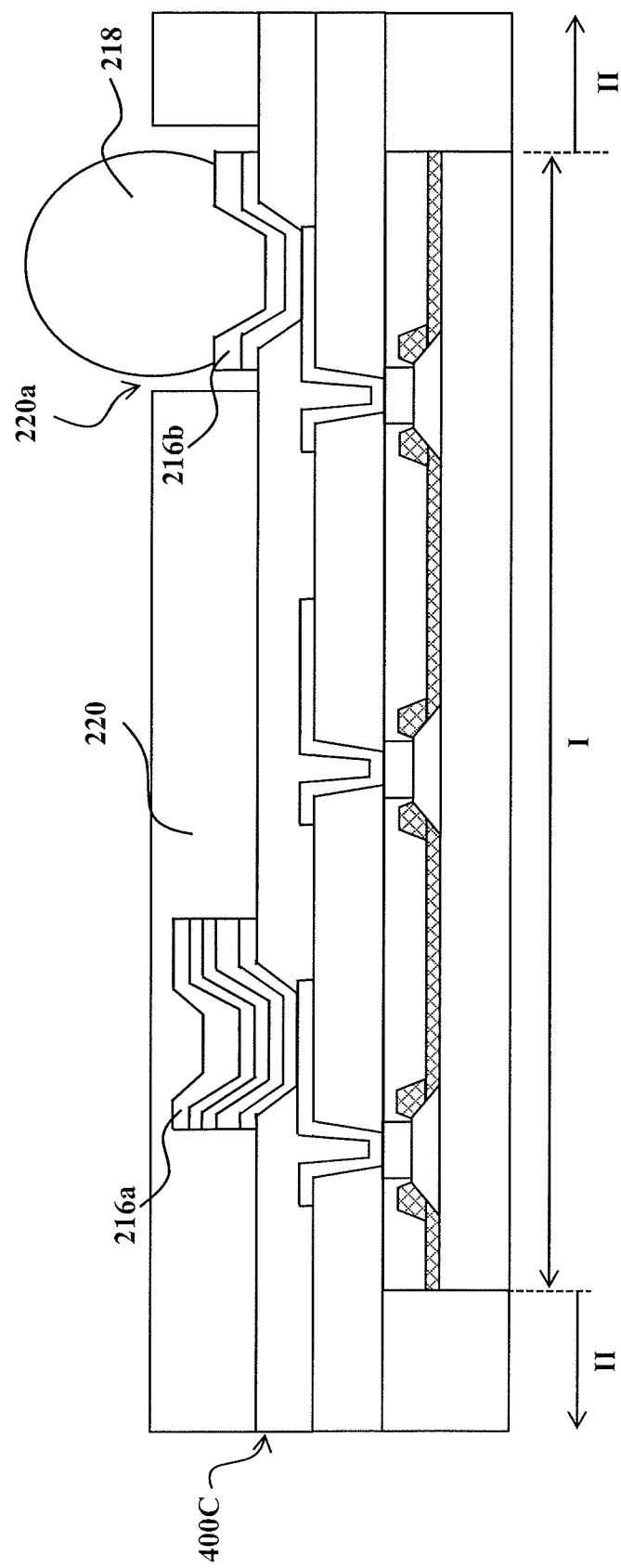
FIG. 12 is a cross-sectional view of a package with a MIM capacitor according to one or more embodiments.
Figure 13:
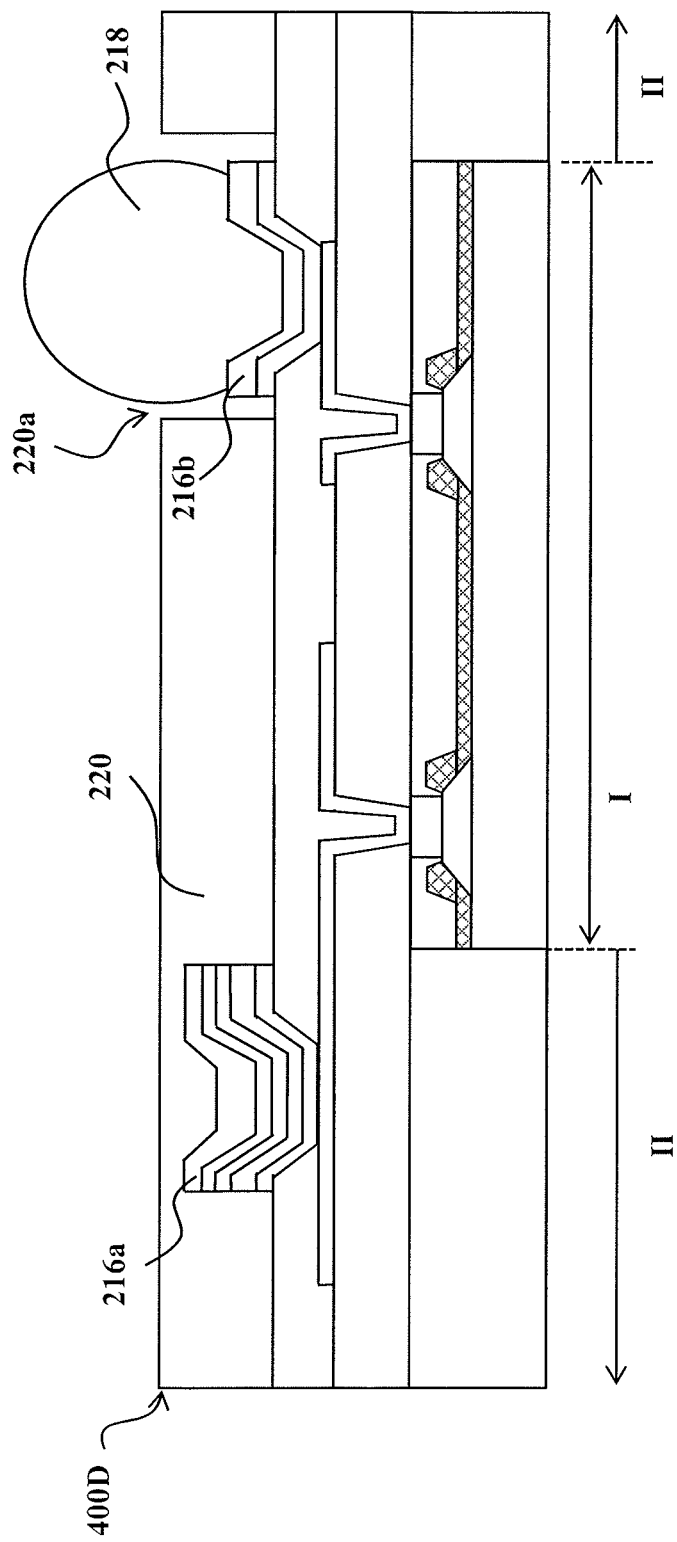
FIG. 13 is a cross-sectional view of a package with a MIM capacitor according to one or more embodiments.

FIG. 12 is a cross-sectional view of a package with a MIM capacitor according to one or more embodiments. An isolation coating 220 is formed after the formation of the UBM layers 216. The isolation coating 220 is formed to cover the UBM layers 216 and the second polymer layer 210, and then patterned to form at least one opening 220a exposing a UBM layer 216b on which a bump 218 will be formed, while a UBM layer 216a formed on the MIM capacitor 300 is still covered by the isolation coating 220. Next, the bump 218 is formed on the exposed portion of the UBM layer 216b. The fan-out package 400C of FIG. 12 shows the embodiment of forming the MIM capacitor 300 on the second polymer layer 210 within the chip area I. In another embodiment, the fan-out package 400D of FIG. 13 shows the MIM capacitor 300 on the second polymer layer 210 within the fan-out area II, in which the MIM capacitor 300 can electrically connect the PPI structure 208 that extends to the fan-out area II.

Figure 14:
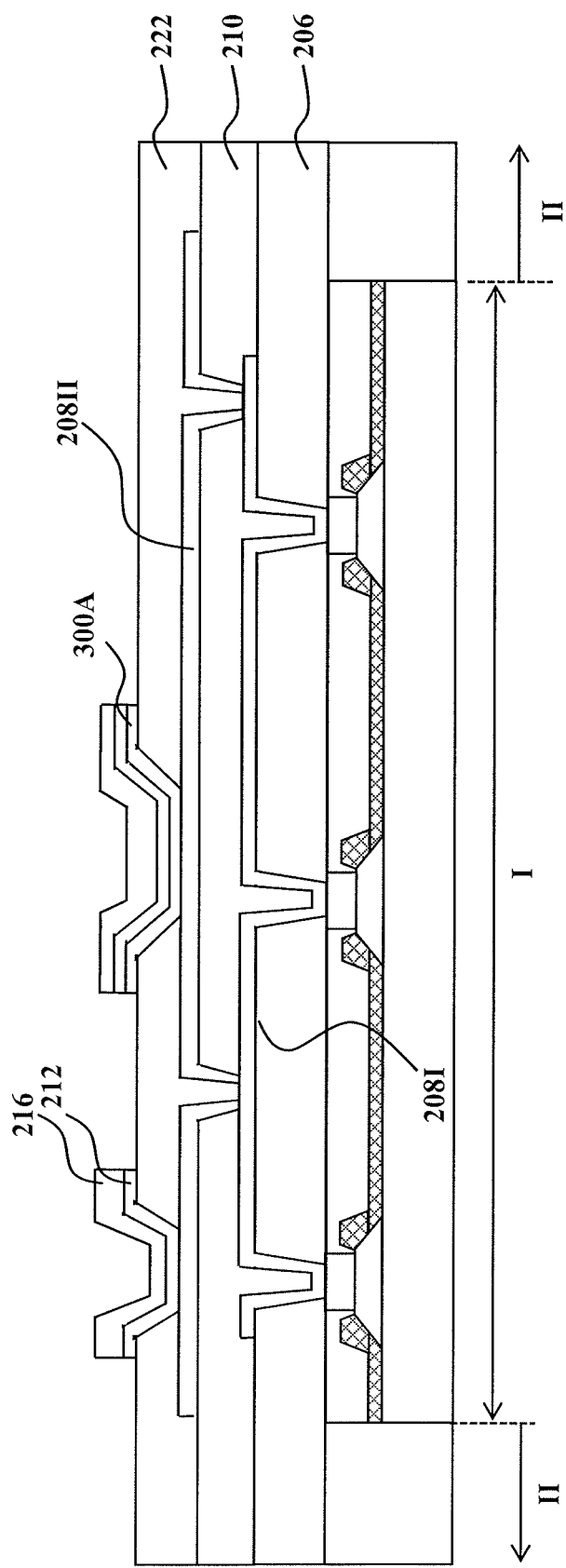
FIGS. 14-16 are cross-sectional views of packages with dual post-passivation interconnect (PPI) structures and MIM capacitors according to one or more embodiments.
Figure 15:
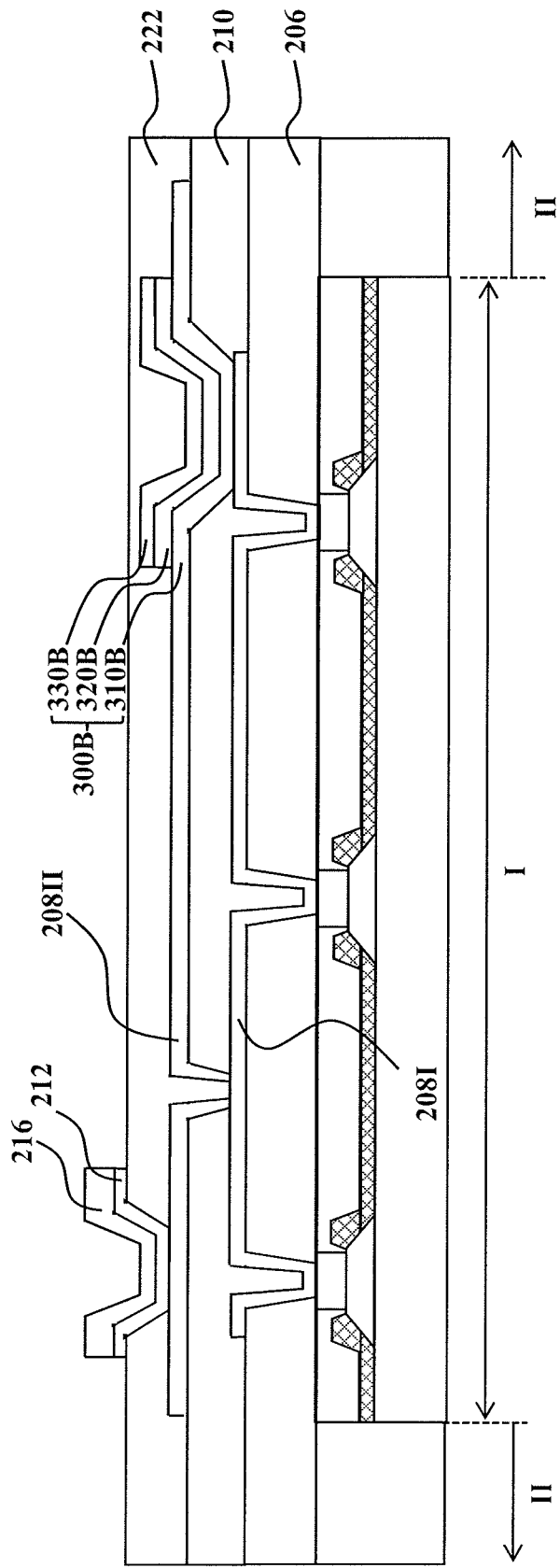
Figure 16:
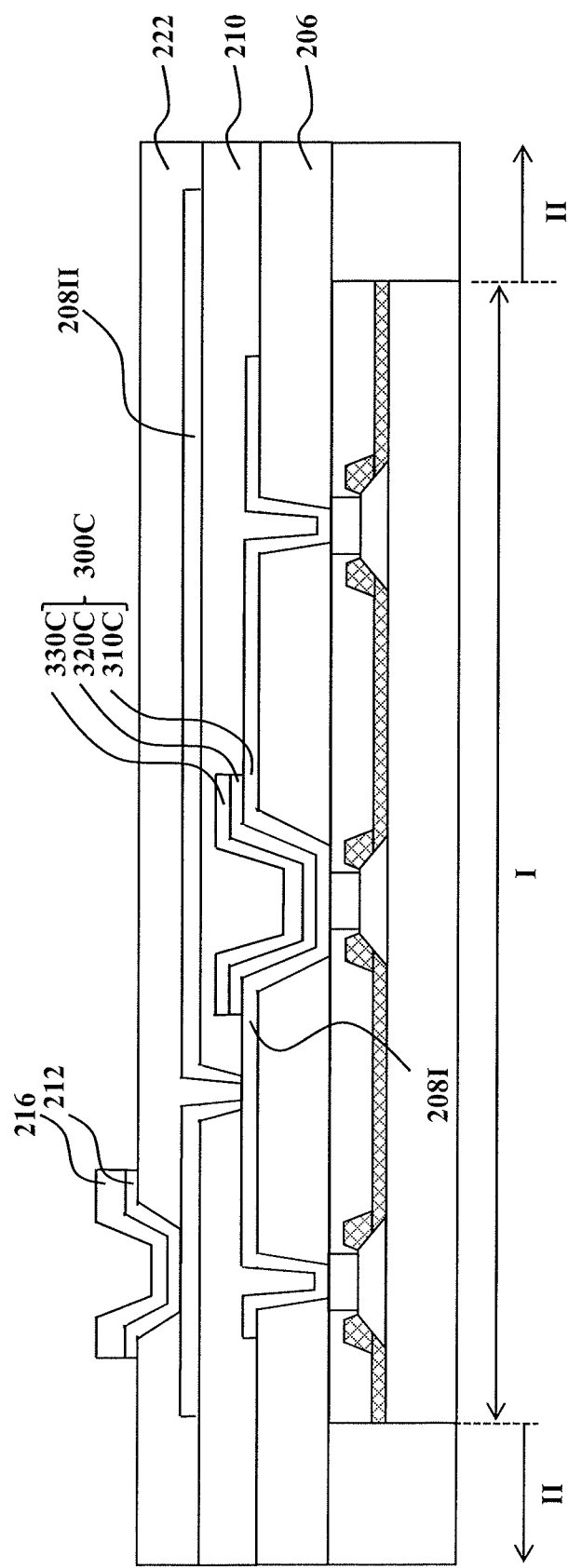

FIGS. 14-16 are cross-sectional views of packages with MIM capacitors on dual PPI structures according to one or more embodiments. The explanation of the same or similar portions to the description in FIGS. 1-13 will be omitted.

Referring to FIG. 14, a plurality of dual PPI structures is formed over the first polymer layer 206. Each of the dual PPI structures includes a first PPI structure 208I and a second PPI structure 208II. The first PPI structure 208I is formed between the first polymer layer 206 and the second polymer layer 210 and electrically coupled to the contacts 18 of the chips 100. The second PPI structure 208II is formed on the second polymer layer 210 and covered by a third polymer layer 222, and is electrically coupled to the first PPI structure 208I through openings in the second polymer layer 210. In some embodiments, MIM capacitors can be formed over at least one of the first polymer layer 206, the second polymer layer 210 or the third polymer layer 222. In some embodiments, MIM capacitors can be formed on the first PPI structure 208I, the second PPI structure 208II or combinations thereof. In some embodiments, MIM capacitors can be formed in the chip area I, the fan-out area II or combinations thereof.

With reference to FIG. 14, a MIM capacitor 300A includes a lower metal layer, a dielectric layer and an upper metal layer formed on the third polymer layer 222 and electrically coupled to the second PPI structure 20811 through an opening in the third polymer layer 222. The barrier layer 212 and the UBM layer 216 may be formed on the MIM capacitor 300A. In some embodiments, the MIM capacitor 300A can be formed in the chip area I, the fan-out area II or the combinations thereof.

With reference to FIG. 15, a MIM capacitor 300B is formed over the second polymer layer 210. In at least one embodiment, the MIM capacitor 300B includes an upper metal layer 330B, a capacitor dielectric layer 320B and a lower metal layer 310B that is a part of the second PPI structure 20811 and/or the first PPI structure 2081. In some embodiments, the MIM capacitor 300B can be formed in the chip area I, the fan-out area II or combinations thereof.

With reference to FIG. 16, a MIM capacitor 300C is formed in the second polymer layer 210. In at least one embodiment, the MIM capacitor 300C includes an upper metal layer 330C, a capacitor dielectric layer 320C and a lower metal layer 310C that is a part of the first PPI structure 2081. In some embodiments, the MIM capacitor 300C can be formed in the chip area I, the fan-out area II or combinations thereof.

FIGS. 17-21 are cross-sectional views of a package at various stages of a method of manufacturing the package with a MIM capacitor according to still other embodiments.

Figure 17:
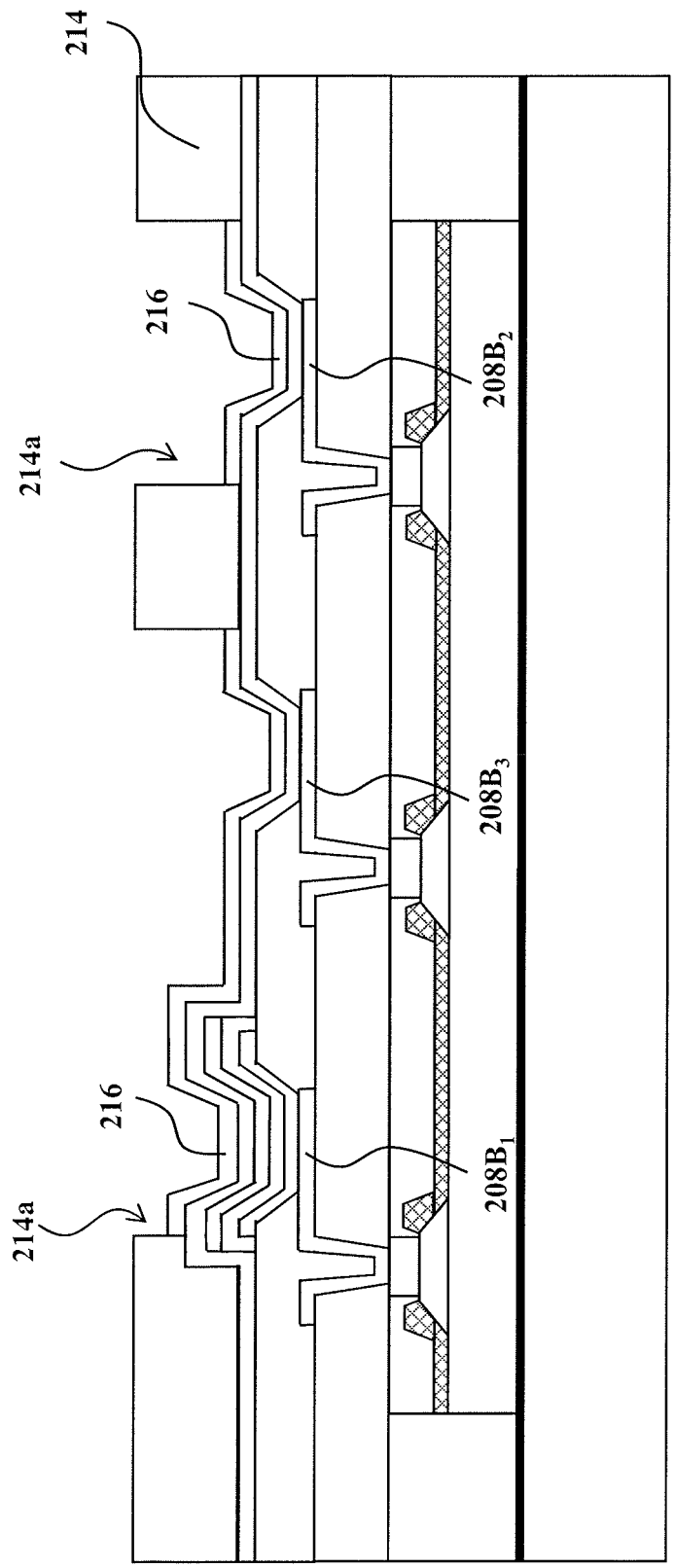
FIGS. 17-21 are cross-sectional views of a method of manufacturing a package with a MIM capacitor according to one or more embodiments.

As shown in FIG. 17, the mask layer 214 formed on the barrier layer 212 is patterned with openings 214a. In some embodiments, the openings 214a are directly over the first landing region $208_{B1}$ and the second landing region $208_{B2}$, and a third landing pad region $208_{B3}$. The third landing pad region $208_{B3}$ is adjacent to the first landing region $208_{B1}$, such that the barrier layer 212 continuously formed on the first landing region $208_{B1}$ and the third landing pad region $208_{B3}$ is exposed by the opening 214a. Next, a plating step is performed to form the UBM layers 216 within the openings 214a, respectively, so that the UBM layers 216 are formed over the exposed portions of the barrier layer 212 to electrically contact with the PPI structures 208.

Figure 18:
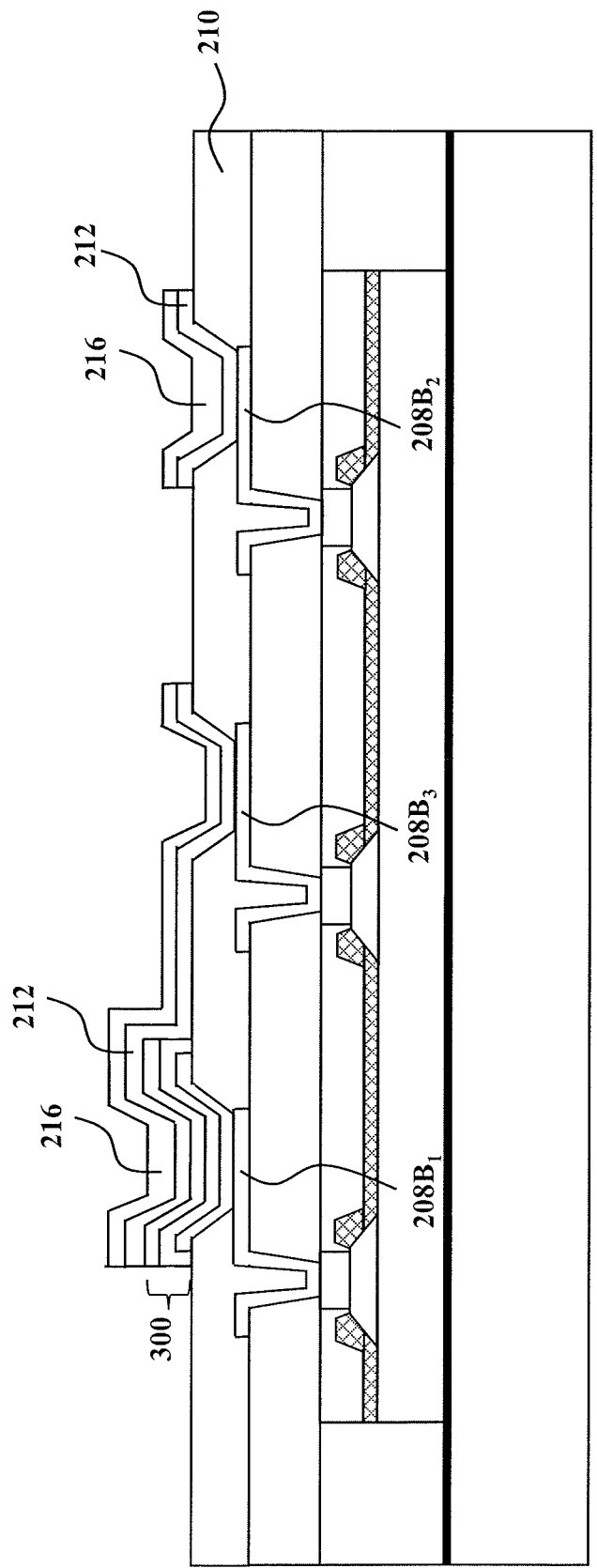

Referring to FIG. 18, the mask layer 214 is removed followed by patterning of the barrier layer 212, so that portions of the barrier layer 212 not covered by the UBM layers 216 are etched away and portions of the second polymer layer 210 not covered by the UBM layers 216 are exposed again. In at least one embodiment, the third landing pad region $208_{B3}$ of the PPI structure 208 adjacent to the MIM structure 300 is covered by the UBM layer 216 and the barrier layer 212.

Figure 19:
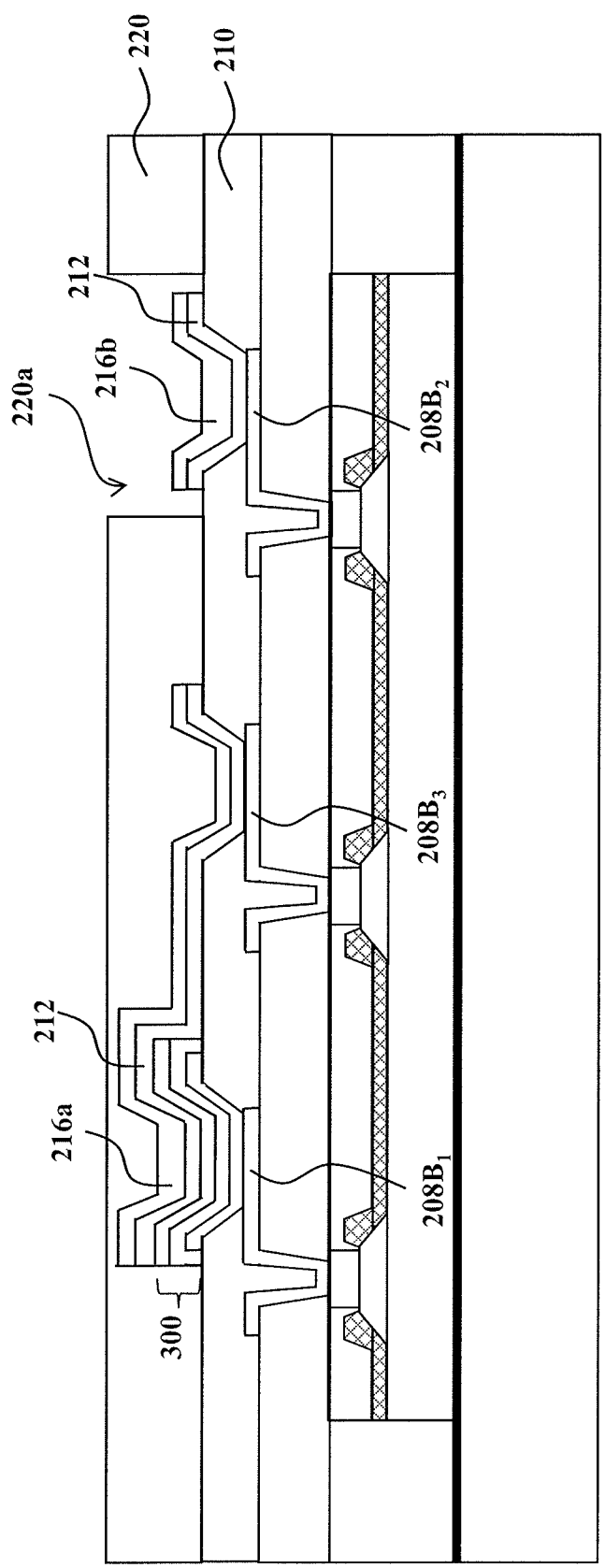

Referring to FIG. 19, an isolation coating 220 is formed to cover the UBM layers 216 and the second polymer layer 210, and then patterned to form at least one opening 220a exposing the UBM layer 216b on which a bump 218 will be formed, while the UBM layer 216a formed on the MIM capacitor 300 is still covered by the isolation coating 220. The isolation layer 220 may prevent oxidation on the UBM layer 216. In at least one embodiment, the isolation coating 220 is formed of a same material as the second polymer layer 210.

Figure 20:
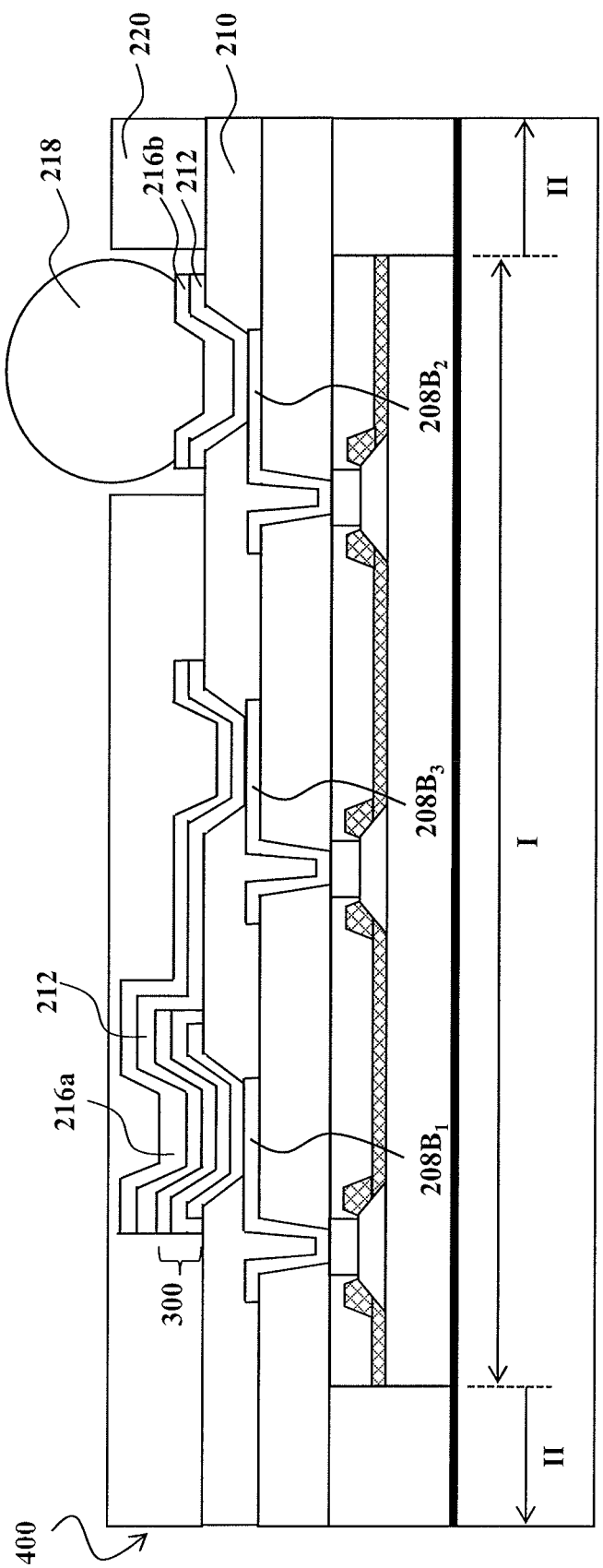
Figure 21:
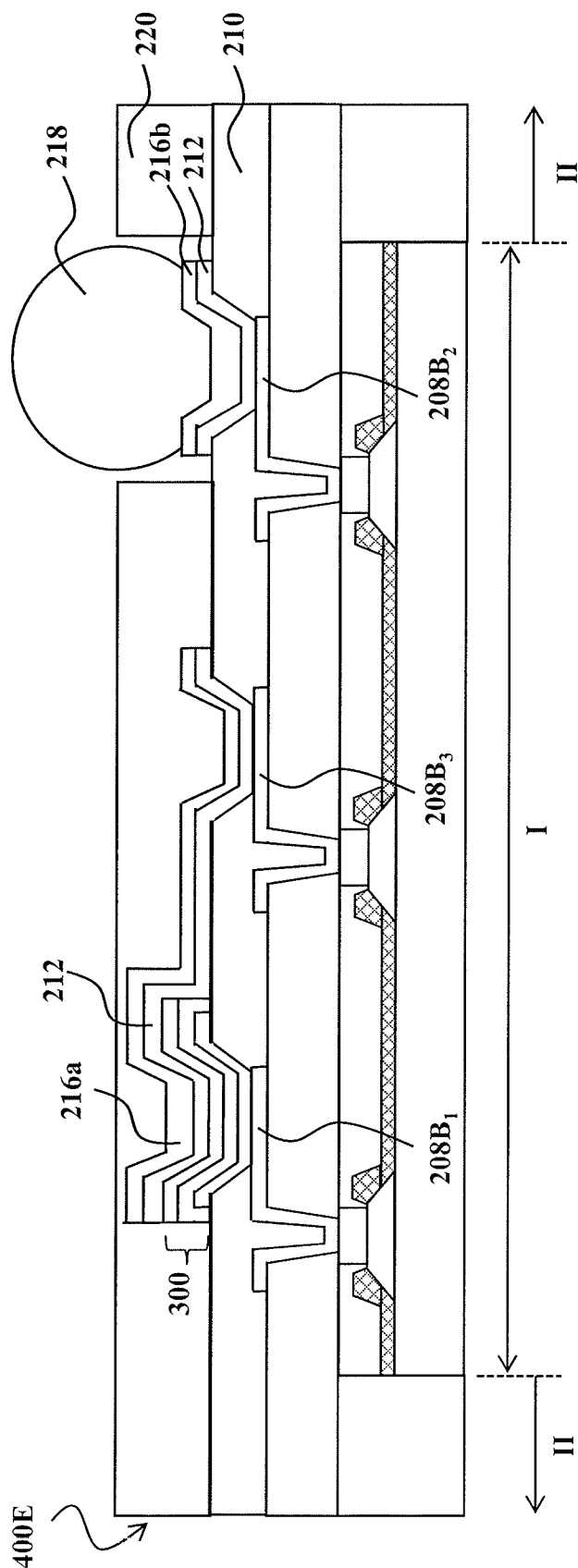

Next, as shown in FIG. 20, the bump 218 is formed on the exposed portion of the UBM layer 216b. Next, as shown in FIG. 21, the reconstructed wafer 400 is detached from the carrier wafer 200, and sawed into a plurality of individual packages 400E. The fan-out package 400E of FIG. 20 shows the embodiment of forming the MIM capacitor 300 on the second polymer layer 210 within the chip area I. In another embodiment of the fan-out package 400E, the MIM capacitor 300 can be formed on the second polymer layer 210 within the fan-out area II, in which the MIM capacitor 300 can electrically connect with the PPI structure 208 that extends to the fan-out area II.

According to the embodiments, a package includes a chip formed in a first area of the package and a molding compound formed in a second area of the package adjacent to the first area. A first polymer layer is formed on the chip and the molding compound, a second polymer layer is formed on the first polymer layer, and a plurality of interconnect structures is formed between the first polymer layer and the second polymer layer. A metal-insulator-metal (MIM) capacitor is formed on the second polymer layer and electrically coupled to at least one of the plurality of interconnect structures. A metal bump is formed over and electrically coupled to at least one of the plurality of interconnect structures.

According to some embodiments, a package includes a chip formed in a first area of the package, a molding compound formed in a second area of the package adjacent to the first area. A first polymer layer is formed on the chip and the molding compound, a second polymer layer is formed on the first polymer layer, and a third polymer layer is formed on the second polymer layer. A first interconnect structure is formed between the first polymer layer and the second polymer layer, and a second interconnect structure is formed between the second polymer layer and the third polymer layer and electrically coupled to the first interconnect structure. A metal-insulator-metal (MIM) capacitor is formed in at least one of the second polymer layer and the third polymer layer, and electrically coupled to at least one of the first interconnect structure and the second interconnect structure.

While the present disclosure has been particularly shown and described with reference to example embodiments thereof, a skilled person in the art will appreciate that there can be many embodiment variations of this disclosure. Although the embodiments and their features have been described in detail, it should be understood that various changes, substitutions and alterations can be made herein without departing from the spirit and scope of the embodiments.

The above method embodiments show exemplary steps, but they are not necessarily required to be performed in the order shown. Steps may be added, replaced, changed order, and/or eliminated as appropriate, in accordance with the spirit and scope of embodiment of the disclosure. Embodiments that combine different claims and/or different embodiments are within scope of the disclosure and will be apparent to those skilled in the art after reviewing this disclosure.

What is claimed is:

1. A package comprising:
a chip and a molding compound adjacent to each other;
a polymer layer on the chip and the molding compound;
a first interconnect structure buried beneath the polymer layer;
a capacitor on the polymer layer and protruding into the polymer layer to the first interconnect structure, wherein the capacitor comprises a lower electrode, a dielectric layer overlying the lower electrode, and an upper electrode overlying the dielectric layer;
a conductive barrier layer overlying and independent of the upper electrode;
a metal layer overlying the conductive barrier layer, wherein the capacitor, the conductive barrier layer, and the metal layer share a common width;
an isolation coating covering the polymer layer and the metal layer; and
a conductive bump in an opening defined by the isolation coating and level with the capacitor.

2. The package according to claim 1, wherein the isolation coating directly contacts a top surface of the metal layer continuously from a first sidewall of the metal layer to a second sidewall of the metal layer opposite the first sidewall, and wherein a separation between the first and second sidewalls is equal to the common width.

3. The package according to claim 1, wherein the capacitor, the conductive barrier layer, and the metal layer define a common sidewall.

4. The package according to claim 3, wherein the isolation coating directly contacts the common sidewall continuously from a top surface of the metal layer to a top surface of the polymer layer.

5. The package according to claim 3, wherein the lower electrode overlies and directly contacts a top surface of the polymer layer, and wherein the dielectric layer and the upper electrode overhang the top surface of the polymer layer.

6. The package according to claim 1, further comprising:
a second interconnect structure buried in the polymer layer; and
an under-bump metallization (UBM) structure on the polymer layer and extending into the polymer layer to the second interconnect structure, wherein the UBM structure cups an underside of the conductive bump and comprises a same material as the conductive barrier layer and a same material as the metal layer.

7. The package according to claim 1, wherein the isolation coating has a downward protrusion directly over the capacitor, and wherein a top surface of the metal layer wraps around the downward protrusion.

8. A package comprising:
a chip and a molding compound that neighbor, wherein the chip comprises a first pad;
a first polymer layer overlying the chip and the molding compound;
a first interconnect structure overlying the first polymer layer;
a capacitor over and partially defined by the first interconnect structure, wherein the capacitor comprises a dielectric layer overlying the first interconnect structure and further comprises a via structure extending through the first polymer layer to proximate the first pad, and wherein a top of the dielectric layer is sunken at the via structure;
a second polymer layer overlying the capacitor and the first polymer layer; and
a first contact extending from the via structure to the first pad.

9. The package according to claim 8, wherein the first contact is pillar shaped.

10. The package according to claim 8, wherein the via structure has a V-shaped profile.

11. The package according to claim 8, wherein the chip comprises:
an insulator layer overlying the first pad and having a top surface that is level with a top surface of the molding compound and a top surface of the first contact, wherein the via structure directly contacts the top surface of the insulator layer.

12. The package according to claim 11, further comprising:
a passivation layer on a sidewall of the first pad, wherein the first contact extends through the passivation layer.

13. The package according to claim 8, wherein the chip further comprises a second pad and a second contact overlying the second pad, wherein the second contact extends upward from the second pad to a top surface of the second contact that is level with the top surface of the molding compound, and where the first polymer layer partially covers the top surface of the second contact and directly contacts the top surface of the second contact.

14. The package according to claim 8, further comprising:
a third polymer layer overlying the second polymer layer, wherein the third polymer layer has a protrusion protruding downward through the second polymer layer to direct contact with the first interconnect structure; and
a second interconnect structure between the second and third polymer layers, wherein the second interconnect structure extends laterally along a top surface of the second polymer layer and has a protrusion protruding downward through the second polymer layer to the first interconnect structure, and wherein the protrusion of the second interconnect structure directly contacts the protrusion of the third polymer layer and a sidewall of the second polymer layer.

15. A package comprising:
a chip and a molding compound that neighbor, wherein the chip comprises a first pad and a first via extending upward from the first pad;
a first polymer layer and a second polymer layer that are stacked on the chip and the molding compound, wherein the second polymer layer overlies the first polymer layer;
a first interconnect structure between the first and second polymer layers; and
a capacitor between the first and second polymer layers, wherein the capacitor overlies the first polymer layer and comprises a bottom electrode defined by the first interconnect structure, and wherein the capacitor has a protrusion protruding through the first polymer layer to the first via and further has a top surface depressed at the protrusion.

16. The package according to claim 15, wherein a top surface of the first via is level with a top surface of the molding compound.

17. The package according to claim 15, wherein the protrusion directly contacts the first via at an interface, and wherein the first via and the protrusion have different widths at the interface.

18. The package according to claim 15, wherein the capacitor comprises a dielectric layer overlying the bottom electrode and further comprises a top electrode overlying the dielectric layer, and wherein the bottom electrode, the dielectric layer, and the top electrode are individually depressed at the protrusion.

19. The package according to claim 15, wherein the chip further comprises a second pad and a second via extending upward from the second pad, and wherein the first interconnect structure is continuous from the first via to the second via.

20. The package according to claim 15, further comprising:
a third polymer layer overlying the second polymer layer, wherein the third polymer layer has a protrusion protruding downward through the second polymer layer to direct contact with the first interconnect structure, and wherein the protrusion of the third polymer layer is spaced from the second polymer layer.

* * * * *